United States Patent
Bang et al.

(10) Patent No.: US 8,379,426 B2
(45) Date of Patent: Feb. 19, 2013

(54) SOLID STATE DEVICE PRODUCTS, INTERMEDIATE SOLID STATE DEVICES, AND METHODS OF MANUFACTURING AND TESTING THE SAME

(75) Inventors: Kwang-kyu Bang, Hwaseong-si (KR); Kwan-jong Park, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 509 days.

(21) Appl. No.: 12/576,561

(22) Filed: Oct. 9, 2009

(65) Prior Publication Data
US 2010/0091539 A1   Apr. 15, 2010

(30) Foreign Application Priority Data
Oct. 14, 2008   (KR) .................. 10-2008-0100741

(51) Int. Cl.
*G11C 5/02* (2006.01)
(52) U.S. Cl. ................ 365/51; 365/201; 361/785
(58) Field of Classification Search ............ 365/51, 365/52, 63, 226, 201, 191; 361/684, 785, 361/737, 790, 788, 791, 796, 797, 736
See application file for complete search history.

(56) References Cited

U.S. PATENT DOCUMENTS

| | | | | |
|---|---|---|---|---|
| 5,485,096 A | * | 1/1996 | Aksu | 324/755.05 |
| 5,745,426 A | * | 4/1998 | Sekiyama | 365/226 |
| 6,029,215 A | * | 2/2000 | Watts et al. | 710/303 |
| 6,644,979 B2 | * | 11/2003 | Huang | 439/65 |
| 6,683,372 B1 | * | 1/2004 | Wong et al. | 257/686 |
| 6,924,986 B1 | * | 8/2005 | Sardella et al. | 361/785 |
| 6,940,153 B2 | * | 9/2005 | Spencer et al. | 257/659 |
| 7,053,471 B2 | | 5/2006 | Wada et al. | |

FOREIGN PATENT DOCUMENTS

| | | |
|---|---|---|
| JP | 5-302951 | 11/1993 |
| JP | 2002-170400 | 6/2002 |

* cited by examiner

*Primary Examiner* — Dang Nguyen
(74) *Attorney, Agent, or Firm* — Harness, Dickey & Pierce, P.L.C.

(57) ABSTRACT

Example embodiments of the inventive concept are directed to solid state device products, intermediate solid state devices, and methods of manufacturing and testing the same, with removable test terminals, which may permit in situ testing of one or more components of the solid state device products.

15 Claims, 9 Drawing Sheets

SOLID STATE DEVICE PRODUCTS, INTERMEDIATE SOLID STATE DEVICES, AND METHODS OF MANUFACTURING AND TESTING THE SAME

CROSS-REFERENCE TO RELATED APPLICATIONS

This application claims priority under 35 U.S.C. §119 to Korean Patent Application No. 10-2008-00100741 filed on Oct. 14, 2008, the contents of which are herein incorporated by reference in their entirety for all purposes.

BACKGROUND

1. Field

Example embodiments of the inventive concept are directed to solid state device products, intermediate solid state devices, and methods of manufacturing and testing the same.

2. Description of the Related Art

A Solid State Device (SSD) is a memory data storage device that utilizes solid state memory, for example, flash-type, non-volatile memory) to store persistent data. SSDs are an alternative to conventional hard drives that have slower memory data access times due to moving parts, for example, rotating disks and/or other moving mechanical parts. The absence of moving parts in an SSD may improve electromagnetic interference (EMI), physical shock resistance, and/or reliability. However, SSDs may be more prone to electrostatic discharge (ESD) relative to a conventional servo motor found in a hard drive, where the recording surfaces may be made of a magnetic material that is more ESD-resistive. ESD may be exacerbated by higher memory densities.

SSDs may have many different structures, sizes, dimensions, volumes, interfaces, and/or compatibilities. Each set of characteristics may be referred to as a form factor. Two examples are a 1.8 inch and 2.5 inch Serial Advanced Technology Attachment (SATA)-2 standard structures. In either structure, the SSD may include one or more of the following, a printed circuit board, one or more controller integrated circuit (ICs), for example, fine-pitch ball grid array (FPBGA) controllers, one or more NAND memory ICs, one or more mobile Synchronous Dynamic Random Access Memory (SDRAM) ICs, one or more voltage detector, one or more voltage regulator, one or more heat sink, one or more diodes, one or more connectors, including input/output (I/O) pins and clock (for, example crystal) pins, and/or a case.

As a result of a plurality of hard drive specifications, many different SSDs, having different interfaces, have been developed.

SUMMARY

Example embodiments of the inventive concept are directed to solid state device products, intermediate solid state devices, and methods of manufacturing and testing the same.

Example embodiments of the inventive concept are directed to solid state device products with removable test terminals. Example embodiments of the inventive concept are directed to intermediate solid state devices with removable test terminals. Example embodiments of the inventive concept are directed to methods of manufacturing solid state device products using removable test terminals. Example embodiments of the inventive concept are directed to methods of manufacturing intermediate solid state devices with removable test terminals. Example embodiments of the inventive concept are directed to methods of testing the components of solid state device products with removable test terminals.

Example embodiments of the inventive concept are directed to solid state device products whose components may be tested in situ. Example embodiments of the inventive concept are directed to intermediate solid state devices usable to test components of solid state device products in situ. Example embodiments of the inventive concept are directed to methods of manufacturing solid state device products whose components may be tested in situ. Example embodiments of the inventive concept are directed to methods of manufacturing intermediate solid state devices usable to test components of solid state device products in situ. Example embodiments of the inventive concept are directed to methods of testing the components of solid state device products in situ.

Example embodiments of the inventive concept are directed to solid state device product including at least one solid state memory including a memory interface including at least one of data inputs, data outputs, control signals, and address signals, and a board to which the at least one solid state memory is attached, the board including a host interface including at least one of the data inputs, the data outputs, the control signals, and the address signals and an interface replicating the memory interface of the at least one solid state memory including the data inputs, the data outputs, the control signals, and the address signals.

Example embodiments of the inventive concept are directed to an intermediate solid state device including at least one solid state memory including a memory interface including at least one of data inputs, data outputs, control signals, and address signals, a board to which the at least one solid state memory is attached, the board including an interface replicating the memory interface of the at least one solid state memory, a removable auxiliary board area, including a plurality of test terminals connected to the interface replicating the memory interface of the at least one solid state memory.

Example embodiments of the inventive concept are directed to a method of manufacturing a solid state device product including providing at least one solid state memory including a memory interface including at least one of data inputs, data outputs, control signals, and address signals, providing a board including a host interface including at least one of the data inputs, the data outputs, the control signals and an interface replicating an interface of at least one solid state memory, providing a removable auxiliary board area, connected to the board, including a plurality of test terminals, connecting the at least one solid state memory to the board, and removing the removable auxiliary board area after the at least one solid state memory has been tested.

Example embodiments of the inventive concept are directed to a method of manufacturing an intermediate solid state device including providing at least one solid state memory including a memory interface including at least one of data inputs, data outputs, control signals, and address signals, providing a board including a host interface including at least one of the data inputs, the data outputs, the control signals and an interface replicating an interface of at least one solid state memory, providing a removable auxiliary board area, connected to the board, including a plurality of test terminals, and connecting the at least one solid state memory to the board.

Example embodiments of the inventive concept are directed to a method of testing a solid state device product including providing at least one solid state memory including a memory interface including at least one of data inputs, data outputs, control signals, and address signals, providing a board including a host interface including at least one of the data inputs, the data outputs, the control signals and an interface replicating an interface of at least one solid state memory, providing a removable auxiliary board area, including a plurality of test terminals, connecting the at least one solid state memory to the board, connecting the removable auxiliary board area to the interface replicating the memory interface of the at least one solid state memory, and testing the at least one solid state memory via the plurality of test terminals connected to the interface replicating the memory interface of the at least one solid state memory.

BRIEF DESCRIPTION OF THE DRAWINGS

The above and other features and advantages of example embodiments of the inventive concept will become more apparent by describing them in detailed with reference to the accompanying drawings.

DETAILED DESCRIPTION

Figure 1:
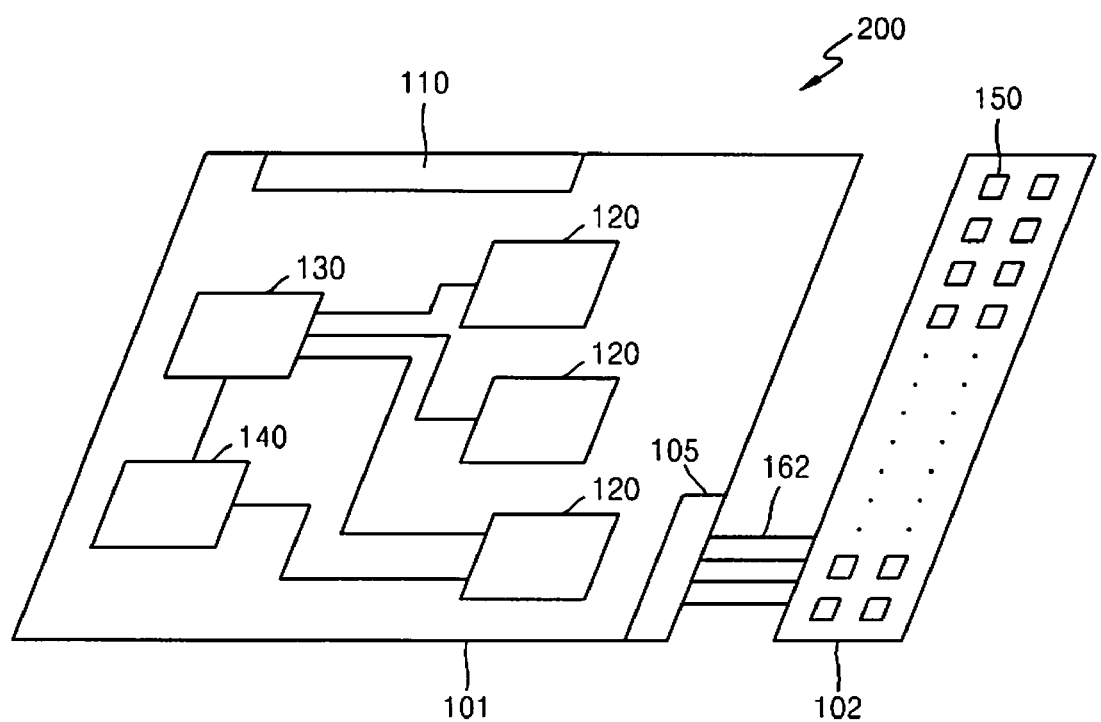
FIG. 1 illustrates an intermediate solid state device in accordance with example embodiments of the inventive concept.

Detailed example embodiments of the inventive concept are disclosed herein. However, specific structural and/or functional details disclosed herein are merely representative for purposes of describing example embodiments of the inventive concept. The claims may, however, may be embodied in many alternate forms and should not be construed as limited to example embodiments of the inventive concept set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section without departing from the teachings of example embodiments of the inventive concept.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments of the inventive concept and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments of the inventive concept belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments of the inventive concept, which are illustrated in the accompanying drawings, wherein like reference numerals refer to the like components throughout. Example embodiments of the inventive concept should not be construed as limited to the particular shapes of regions illustrated in these figures but are to include deviations in shapes that result, for example, from manufacturing.

FIG. 1 illustrates an intermediate solid state device 200 in accordance with example embodiments of the inventive concept. As shown in FIG. 1, an intermediate solid state device 200 may include at least one circuit board 100 and at least one connector 110. In example embodiments of the inventive concept, each circuit board 100 may further include at least one main board 101 and at least one auxiliary board 102. In example embodiments of the inventive concept, each circuit board 100 may be a printed circuit board (PCB).

In example embodiments of the inventive concept, the at least one connector 110 is an electronic connector. In example embodiments of the inventive concept, the at least one connector 110 facilitates a connection with external electronic equipment. In example embodiments of the inventive concept, the at least one connector 110 is on one side of the at least one main board 101.

As shown in FIG. 1, the intermediate solid state device 200 may further include other electronic components, for example, at least one semiconductor memory 120, at least one memory controller 130, and/or at least one buffer memory 140. These electronic components may be provided in any number and connected in any manner and any configuration. The configuration in FIG. 1 is an example.

The at least one circuit board 100 may include the necessary printed circuit patterns to form suitable electrical connection between the electronic components 120, 130, and/or 140. In example embodiments of the inventive concept, the at least one semiconductor memory 120 is a NAND flash, a phase change random access memory (PRAM), a magnetic random access memory (MRAM), a ferromagnetic random access memory (FRAM), or a resistive random access memory (RRAM).

In example embodiments of the inventive concept, each of the at least one semiconductor memories 120 may be a semiconductor package or a semiconductor chip, which may include a bump-type connection. In example embodiments of the inventive concept, each of the at least one semiconductor memories 120 may be attached on a top of the at least one main board 101 or a bottom of the at least one main board 101.

Figure 2:
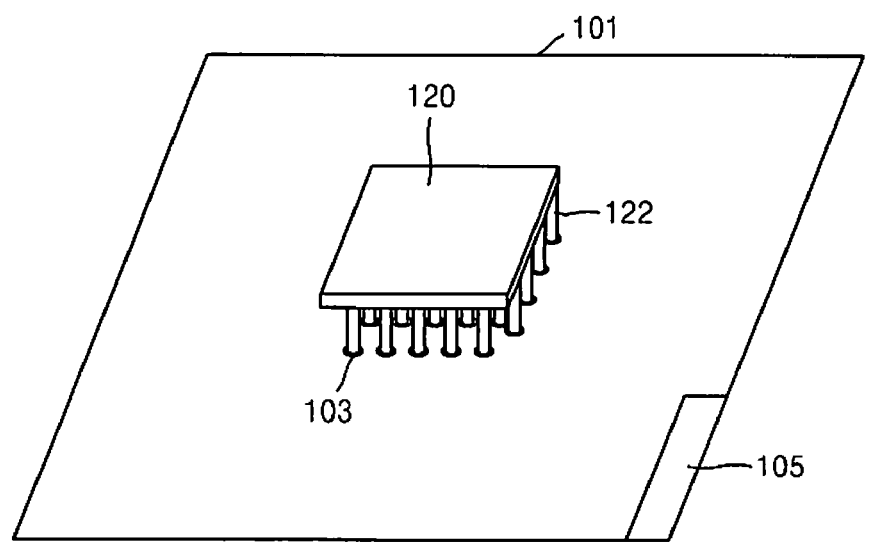
FIG. 2 illustrates at least one semiconductor memory and at least one main board in accordance with example embodiments of the inventive concept.

FIG. 2 illustrates the at least one semiconductor memory 120 and the at least one main board 101 in accordance with example embodiments of the inventive concept. As shown, the at least one semiconductor memory 120 may have a memory interface 122 and the at least one main board 101 may have a host interface 103. Both the memory interface 122 and the host interface 103 may include any combination of wires, pads, balls, bumps, patterns and/or other elements to make an electrical connection between the at least one semiconductor memory 120 and the at least one main board 101. In example embodiments of the inventive concept, the memory interface 122 may include at least one of data inputs, data outputs, control signals, and address signals. In example embodiments of the inventive concept, the host interface 103 may include at least one of data inputs, data outputs, control signals, and address signals.

As shown in FIG. 2, the at least one main board 101 may also include a replica interface 105. In example embodiments of the inventive concept, the replica interface 105 may be an interface replicating the memory interface 122. In other example embodiments of the inventive concept, the replica interface 105 may be an interface replicating the memory interface 122 or another interface on the at least one main board 101. In example embodiments of the inventive concept, the replica interface 105 may include the same data inputs, data outputs, control signals, and address signals as the interface to be replicated. In example embodiments of the inventive concept, the replica interface 105 may include the same data inputs, data outputs, control signals, and address signals as the memory interface 122.

In example embodiments of the inventive concept, the memory interface 122, the host interface 103 and/or the replica interface 105 may have additional signals. In example embodiments of the inventive concept, the memory interface 122, the host interface 103 and/or the replica interface 105 may have different pin configurations.

In example embodiments of the inventive concept, the memory interface 122, the host interface 103 and/or the replica interface 105 have at least one common input and output.

In example embodiments of the inventive concept, the memory interface 122, the host interface 103 and/or the replica interface 105 include a plurality of input and outputs used for normal operation. In example embodiments of the inventive concept, the replica interface 105 is used for testing.

Returning to FIG. 1, in example embodiments of the inventive concept, the at least one auxiliary board 102 of the solid state drive 200 may be electrically connected through signal wiring 162 with the at least one main board 101. In example embodiments of the inventive concept, the signal wiring 162 may be suitable to inspect and/or test the at least one semiconductor memory 120 of the at least one main board 101. In example embodiments of the inventive concept, the signal wiring 162 may be part of a flexible cable.

In example embodiments of the inventive concept, the at least one auxiliary board 102 may include the plurality of test terminals 150 on a surface thereof. In example embodiments of the inventive concept, the at least one auxiliary board 102 is connected to the replica interface 105. If the replica interface 105 replicates the memory interface 122 of the at least one semiconductor memory 120, the at least one semiconductor memory 120 may be tested via the plurality of test terminals 150.

In example embodiments of the inventive concept, a connector (for example, one or more pogo pins) of a semiconductor package tester may contact the plurality of test terminals 150 to analyze the operation of the at least one semiconductor memory 120 (or any other electronic component 120, 130, and/or 140). As a result, the at least one semiconductor memory 120 (or any other electronic component 120, 130, and/or 140) may be tested in situ on the at least one main board 101, without having to be removed, tested, and returned.

Figure 3:
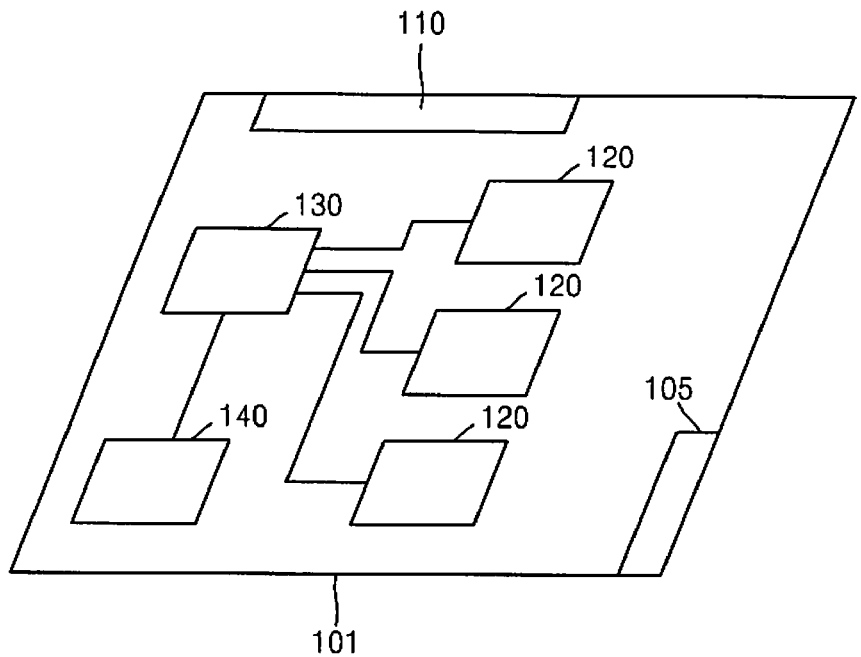
FIG. 3 illustrates a solid state device product in accordance with example embodiments of the inventive concept, where at least one auxiliary board has been removed.

After testing, in example embodiments of the inventive concept, the at least one auxiliary board 102 may be removed from the at least one main board 101. In example embodiments of the inventive concept, the at least one auxiliary board 102 is not part of a solid state device product delivered to a customer. FIG. 3 illustrates a solid state device product in accordance with example embodiments of the inventive concept, where the at least one auxiliary board 102 has been removed.

Figure 4:
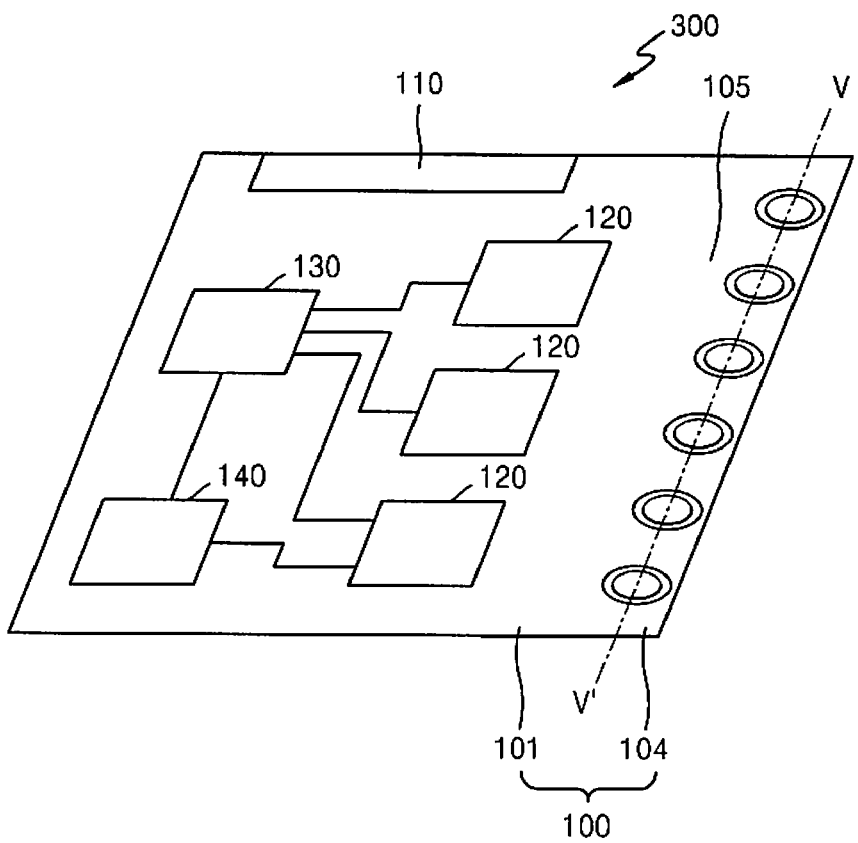
FIG. 4 illustrates an intermediate solid state device in accordance with example embodiments of the inventive concept.

FIG. 4 illustrates an intermediate solid state device in accordance with example embodiments of the inventive concept. As shown in FIG. 4, an intermediate solid state device 300 may include at least one circuit board 100 and at least one connector 110. In example embodiments of the inventive concept, each circuit board 100 may further include at least one main board 101 having a portion 104. In example embodiments of the inventive concept, the at least one circuit board 100 may be a printed circuit board (PCB).

In example embodiments of the inventive concept, the at least one main board 101 and the portion 104 are delineated by a plurality of through or via holes 170.

In example embodiments of the inventive concept, a connector (for example, one or more pogo pins) of a semiconductor package tester may contact the plurality of through or via holes 170 to analyze the at least one semiconductor memory 120 (or any other electronic component 120, 130, and/or 140). As a result, the at least one semiconductor memory 120 (or any other electronic component 120, 130, and/or 140) may be tested in situ on the at least one main board 101, without having to be removed, tested, and returned.

In example embodiments of the inventive concept, the plurality of through or via holes 170 are cylindrical.

Figure 5:
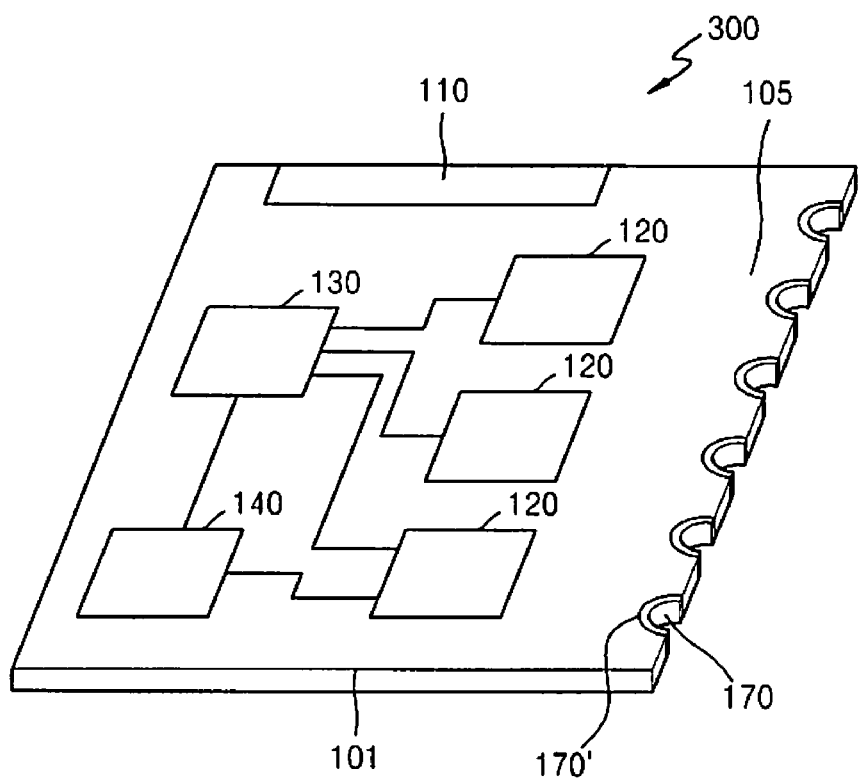
FIG. 5 illustrates a solid state device product in accordance with example embodiments of the inventive concept, where a portion has been removed.

After testing, in example embodiments of the inventive concept, the portion 104 may be removed from the at least one main board 101. In example embodiments of the inventive concept, the at least one main board 101 may be cut along V-V'. In the cutting process, the portion 104 of at least one main board 101 is removed and the plurality of through or via holes 170 may have a half-circle form. At V-V', the inner sides 170' of the plurality of through or via holes 170 are exposed as shown in FIG. 5.

In example embodiments of the inventive concept, the inner sides 170' of the plurality of through or via holes 170 which are exposed may be used as test terminals which connect with a semiconductor package tester.

In example embodiments of the inventive concept, the connector of the semiconductor package tester may contact the inner sides 170' of the plurality of through or via holes 170 and be used to test one or more of the electronic components which is placed on the at least one main board 101.

In example embodiments of the inventive concept, the portion 104 is not part of a solid state device product delivered to a customer. FIG. 5 illustrates a solid state device product in accordance with example embodiments of the inventive concept, where the portion 104 has been removed.

Any or all of the features discussed above with respect to FIGS. 1-3 may be applied to example embodiments of the inventive concept of FIGS. 4-5, and vice versa.

Figure 6:
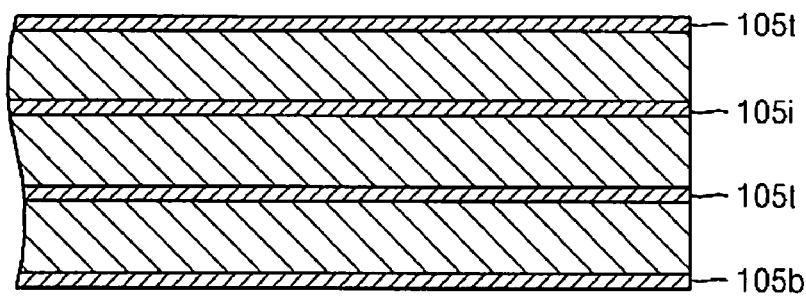
FIG. 6 illustrates a replica interface in accordance with example embodiments of the inventive concept.

FIG. 6 illustrates the replica interface 105 in accordance with example embodiments of the inventive concept. In example embodiments of the inventive concept, the at least one main board 101, the memory interface 122, the host interface 103 and/or the replica interface 105 may be multi-layered. As shown, the multi-layered replica interface 105 may include at least one of patterns 105t, 105i, and/or 105b. As shown, pattern 105t is on top of a surface of the at least one main board 101, pattern 105i is within the at least one main board 101, and pattern 105b is on the bottom of the bottom surface of the at least one main board 101.

In example embodiments of the inventive concept, the replica interface 105 is at least on an edge of the board (represented by patterns 105t, 105i, and/or 105b). In example embodiments of the inventive concept, the replica interface 105 is not on a layout surface of the board (represented by patterns 105t or 105b). In example embodiments of the inventive concept, the replica interface 105 is on an edge of the board (represented by patterns 105t, 105i, and/or 105b) and on at least the top and bottom of the board (represented by patterns 105t or 105b). In example embodiments of the inventive concept, the replica interface 105 is an exposed interlayer of the board (represented by patterns 105i). In example embodiments of the inventive concept, the replica interface 105 is not a top of a top layer of the board and not a bottom of a bottom layer of the board (represented by a top of pattern 105t or a bottom of pattern 105b). In example embodiments of the inventive concept, the replica interface 105 is an exposed multilayer including at least one exposed interlayer (represented by patterns 105t, 105i, and/or 105b). In example embodiments of the inventive concept, the replica interface 105 is a middle layer 105i and a top of a top layer of the board or a bottom of a bottom layer of the board (represented by a top of pattern 105t or a bottom of pattern 105b).

In example embodiments of the inventive concept, the replica interface 105 may be connected to the other electronic components, for example, at least one semiconductor memory 120, at least one memory controller 130, and/or at least one buffer memory 140 by multi-layered patterns (not shown). In example embodiments of the inventive concept, the at least one connector 110 may be connected to the other electronic components, for example, at least one semiconductor memory 120, at least one memory controller 130, and/or at least one buffer memory 140 by multi-layered patterns (also not shown).

Figure 7:
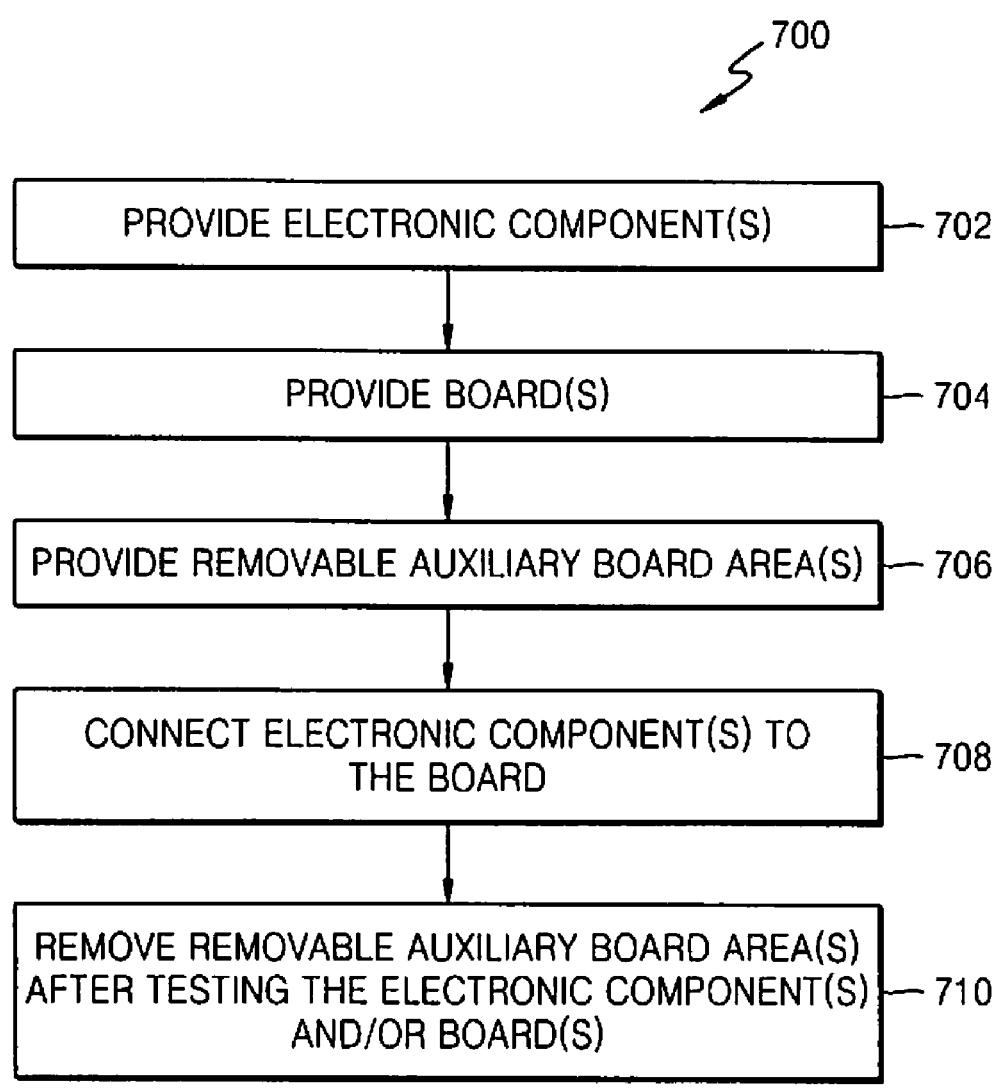
FIG. 7 illustrates a method of manufacturing an intermediate solid state device and a solid state device product in accordance with example embodiments of the inventive concept.

FIG. 7 illustrates a method 700 of manufacturing an intermediate solid state device and a solid state device product in accordance with example embodiments of the inventive concept. As illustrated in FIG. 7, in operation 702, at least one electronic component, for example, at least one semiconductor memory 120 is provided including a memory interface 122. The memory interface 122 may include at least one of data inputs, data outputs, control signals and address signals.

In operation 704, at least one board, for example, at least one main board 101 is provided including a host interface 103. The host interface 103 may also include at least one of the data inputs, data outputs, control signals, and address signals. The at least one board 101 may also include a replica interface 105, which may replicate any of the interfaces of the electronic components, for example, the at least one semiconductor memory 120, the at least one memory controller 130, and/or the at least one buffer memory 140 or any interface on the at least one main board 101.

In operation 706, at least one removable auxiliary board area, connected to the at least one board 101 may be provided. In example embodiments of the inventive concept, the removable auxiliary board area may be the at least one auxiliary board 102 of FIG. 1 or the portion 104 of FIG. 4. In example embodiments of the inventive concept, the at least one auxiliary board 102 may include the plurality of test terminals 150. In example embodiments of the inventive concept, the portion 104 may include the plurality of through or via holes 170.

In operation 708, the at least one electronic component may be connected to the at least one board. In example embodiments of the inventive concept, operations 702-708 produce an intermediate solid state device, as shown for example in FIG. 1 or FIG. 4.

To manufacture a solid state device product, operation 710 may be additionally performed in which the removable auxiliary board area is removed from the intermediate solid state device after the at least one electronic component has been tested. In example embodiments of the inventive concept such as those shown in FIG. 1, the at least one auxiliary board 102 may be disconnected from the at least one main board 101. In example embodiments of the inventive concept such as those shown in FIG. 4, the portion 104 may be cut from the at least one main board 101.

Figure 8:
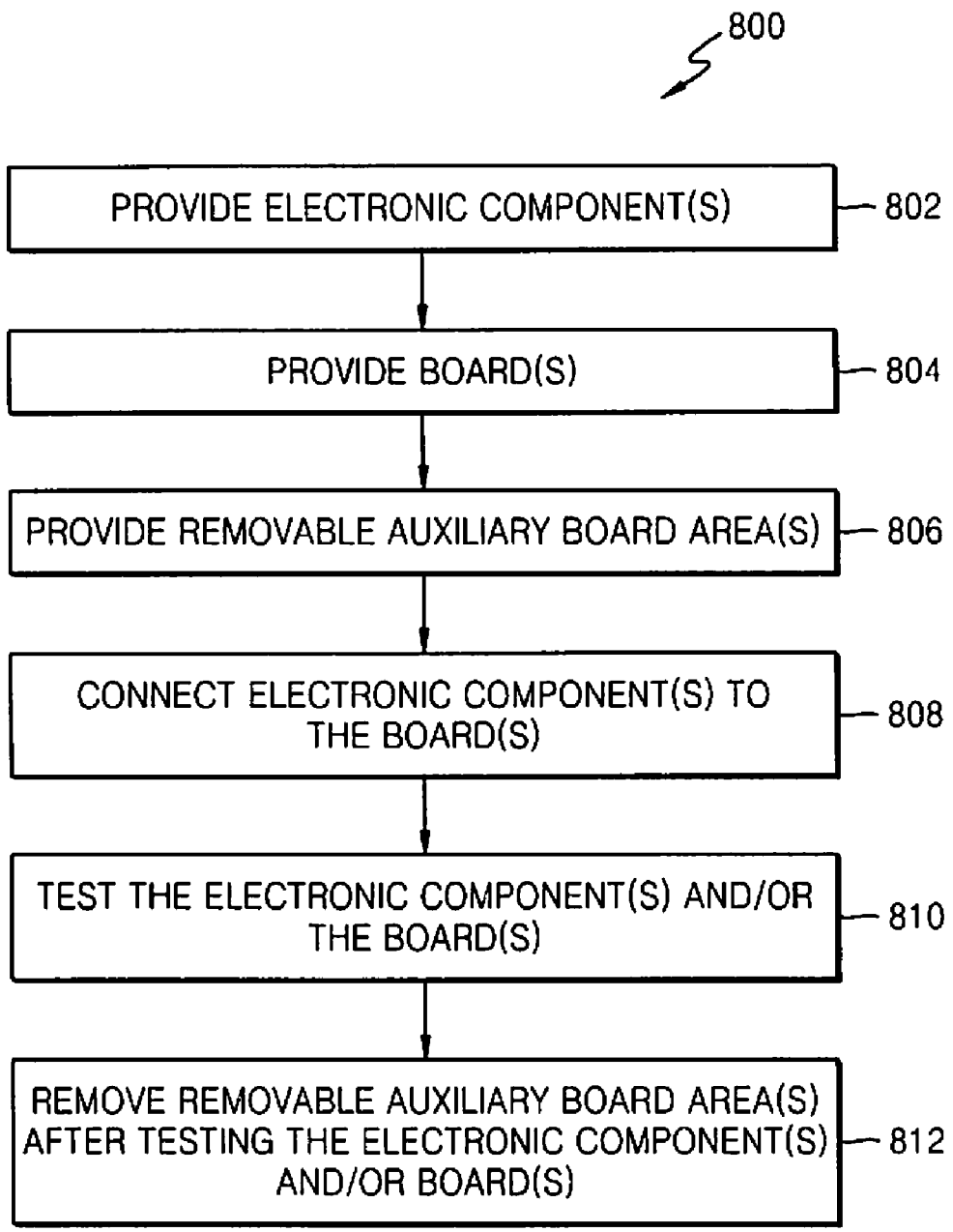
FIG. 8 illustrates a method of testing a solid state device product in accordance with example embodiments of the inventive concept.

FIG. 8 illustrates a method 800 of testing a solid state device product. In example embodiments of the inventive concept as illustrated in FIG. 8, in operation 802, at least one electronic component may be provided. The at least one electronic component may be the at least one semiconductor memory 120, at least one memory controller 130, and/or at least one buffer memory 140. In example embodiments of the inventive concept, the at least one electronic component is at least one semiconductor memory 120. In example embodiments of the inventive concept, the at least one semiconductor memory 120 includes the memory interface 122 including at least one of data inputs, data outputs, control signals, and address signals.

In operation 804, at least one board, for example, at least one main board 101 may be provided including a host interface 103 and a replica interface 105. The host interface 103 may include at least one of the data inputs, the data outputs, control signals, and address signals. The replica interface 105 may replicate any one of the interfaces in electronic components 120, 130, 140 or the at least one main board 101.

As shown in operation 806, at least one removable auxiliary board area may be provided, for example, the at least one auxiliary board 102 of FIG. 1 or the portion 104 of FIG. 4. The at least one removable auxiliary board area may include a plurality of test terminals, for example, the plurality of test terminals 150 of FIG. 1 or the plurality of through or via holes 170 of FIG. 4.

In operation 808, the at least one removable auxiliary board area is connected to the replica interface 105, for example, an interface replicating the memory interface 122 of the at least one semiconductor memory 120.

In operation 810, the at least one semiconductor memory 120 is tested via the plurality of test terminals 150 or 170 connected to interface replicating the memory interface 122 of the at least one semiconductor memory 120.

In operation 812, the removable auxiliary board area may be removed after the at least one electronic component and/or the at least one board has been tested. In example embodiments of the inventive concept such as those shown in FIG. 1, the at least one auxiliary board 102 may be disconnected from the at least one main board 101. In example embodiments of the inventive concept such as those shown in FIG. 4, the portion 104 may be cut from the at least one main board 101.

Example embodiments of the inventive concept of solid state device products and intermediate solid state devices, as discussed above may be implemented as components or sub-components in one or more sub-system or system as described in more detail below.

Figure 9:
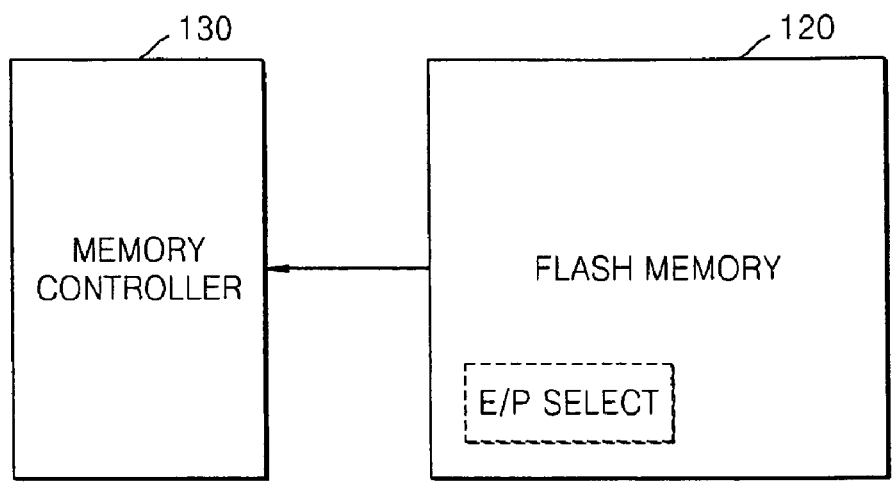
FIG. 9 illustrates an example embodiment including a memory controller in accordance with example embodiments of the inventive concept.

FIG. 9 illustrates an example embodiment including a memory controller in accordance with example embodiments of the inventive concept. As shown, FIG. 9 includes at least one semiconductor memory 120 connected to at least one memory controller 130. The at least one semiconductor memory 120 may be a NAND flash memory or NOR flash memory. However, the at least one semiconductor memory 120 is not limited to these memory types, and may be any memory type.

The at least one memory controller 130 may supply the input signals for controlling operation of the at least one semiconductor memory 120. For example, in the case of a NAND flash memory, the at least one memory controller 130 may supply the command CMD and address signals. In examples of a NOR flash memory, the at least one memory controller 130 may supply CMD, ADD, DQ and VPP signals. It will be appreciated that the at least one memory controller 130 may control the at least one semiconductor memory 120 based on received control signals (not shown).

Figure 10:
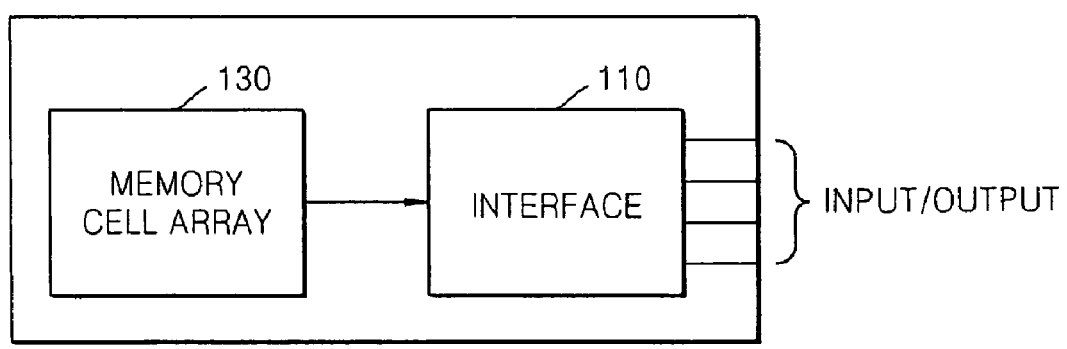
FIG. 10 illustrates another example embodiment including an interface in accordance with example embodiments of the inventive concept.

FIG. 10 illustrates another example embodiment including an interface in accordance with example embodiments of the inventive concept. As shown, FIG. 10 includes at least one semiconductor memory 120 connected to an interface 515, which may be part of the at least one connector 110. The at least one semiconductor memory 120 may be a NAND flash memory or a NOR flash memory. However, the at least one semiconductor memory 120 is not limited to these memory types, and may be any memory type.

The interface 515 may supply the input signals (for example, generated externally) for controlling operation of the at least one semiconductor memory 120. For example, in the case of a NAND flash memory, the interface 515 may supply the command CMD and address signals. In the example of a NOR flash memory, the interface 515 may supply CMD, ADD, DQ and VPP signals. It will be appreciated that the interface 515 may control the at least one semiconductor memory 120 based on received control signals (for example, generated externally, but not shown).

Figure 11:
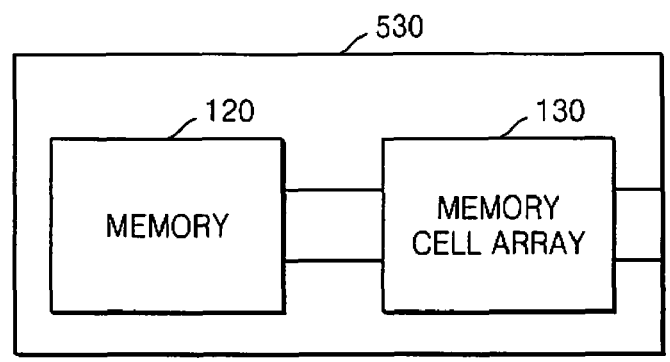
FIG. 11 illustrates an example memory card in accordance with example embodiments of the inventive concept.

FIG. 11 illustrates an example memory card in accordance with example embodiments of the inventive concept. FIG. 11 is similar to FIG. 9, except that the at least one semiconductor memory 120 and at least one memory controller 130 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the at least one memory controller 130 may control the at least one semiconductor memory 120 based on controls signals received by the card 530 from another (e.g., external) device.

Figure 12:
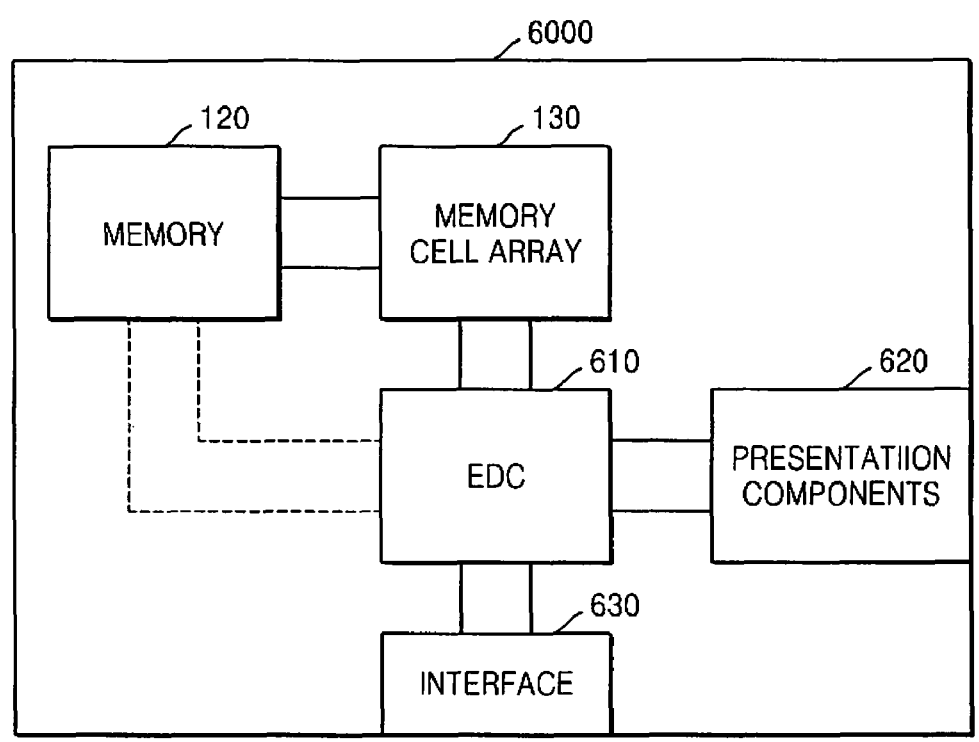
FIG. 12 illustrates an example portable device in accordance with example embodiments of the inventive concept.

FIG. 12 illustrates an example portable device in accordance with example embodiments of the inventive concept. FIG. 12 represents a portable device 6000. The portable device 6000 may be an MP3 player, video player, combination video and audio player, etc. As shown, the portable device 6000 includes the at least one semiconductor memory 120 and at least one memory controller 130. The portable device 6000 may also includes an encoder and decoder 610, presentation components 620 and interface 630, which may be part of the at least one connector 110.

Data (video, audio, etc.) may be input to and output from the at least one semiconductor memory 120 via the at least one memory controller 130 by an encoder and decoder (EDC) 610. As shown by the dashed lines in FIG. 12, the data may be directly input to the at least one semiconductor memory 120 from the EDC 610 and/or directly output from the at least one semiconductor memory 120 to the EDC 610.

The EDC 610 may encode data for storage in the at least one semiconductor memory 120. For example, the EDC 610 may perform MP3 encoding on audio data for storage in the at least one semiconductor memory 120. Alternatively, the EDC 610 may perform MPEG encoding (e.g., MPEG2, MPEG4, etc.) on video data for storage in the at least one semiconductor memory 120. Still further, the EDC 610 may include multiple encoders for encoding different types of data according to different data formats. For example, the EDC 610 may include an MP3 encoder for audio data and an MPEG encoder for video data.

The EDC 610 may decode output from the at least one semiconductor memory 120. For example, the EDC 610 may perform MP3 decoding on audio data output from the at least one semiconductor memory 120. Alternatively, the EDC 610 may perform MPEG decoding (e.g., MPEG2, MPEG4, etc.) on video data output from the at least one semiconductor memory 120. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include decoders. For example, already encoded data may be received by the EDC 610 and passed to the at least one memory controller 130 and/or the at least one semiconductor memory 120.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the at least one semiconductor memory 120 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 13:
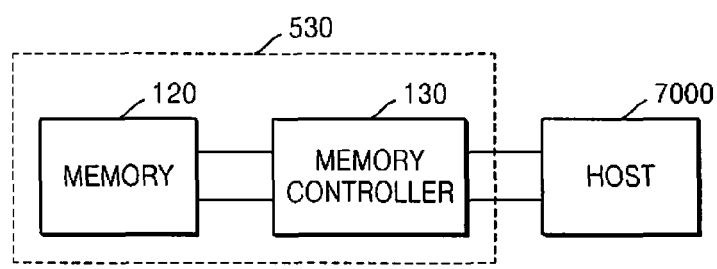
FIG. 13 illustrates an example memory card and host system in accordance with example embodiments of the inventive concept.

FIG. 13 illustrates an example memory card and host system in accordance with example embodiments of the inventive concept in which the host system 7000 is connected to the card 530 of FIG. 11. In example embodiments of the inventive concept, the host system 7000 may apply control signals to the card 530 such that the at least one memory controller 130 controls operation of the at least one semiconductor memory 120.

Figure 14:
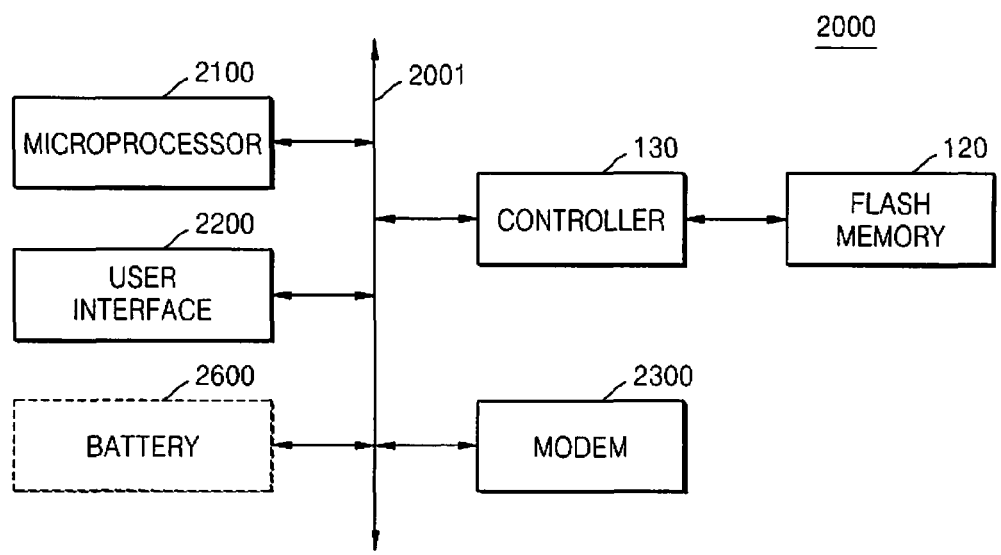
FIG. 14 illustrates an example system in accordance with example embodiments of the inventive concept.

FIG. 14 illustrates an example system in accordance with example embodiments of the inventive concept. As shown, system 2000 may include a microprocessor 2100, user interface 2200, for example, a keypad, a keyboard, and/or a display, modem 2300, at least one memory controller 130, at least one semiconductor memory 120 and/or battery 2600. In example embodiments of the inventive concept, each of the system elements may be combined each other through a bus 2001.

The at least one memory controller 130 may also include one or more microprocessors, a digital signal processor, a microcontroller, or any processor similar to the above. The at least one semiconductor memory 120 may be used to store data and/or commands executed by the at least one memory controller 130. The at least one semiconductor memory 120 may be any of any of the memories described in example embodiments of the inventive concept above.

The modem 2300 may be used to transmit data to and/or from another system, for example, a communication network. The system 2000 may be part of a mobile system, such as a PDA, a portable computer, web tablet, a wireless phone, a mobile phone, a digital music player, memory card, or other system transmitting and/or receiving information.

Figure 15:
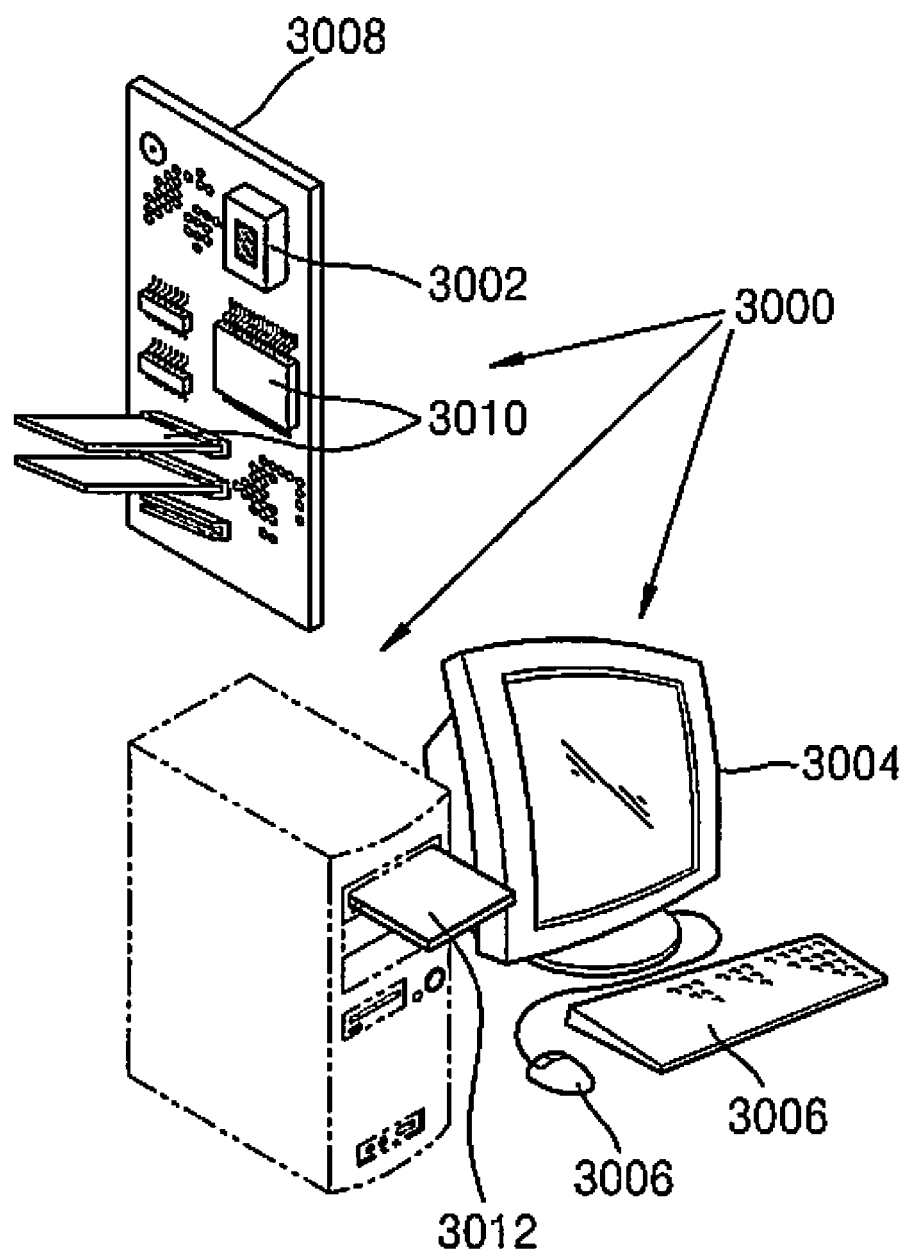
FIG. 15 illustrates an example computer system in accordance with example embodiments of the inventive concept.

FIG. 15 illustrates an example computer system in accordance with example embodiments of the inventive concept. As shown, the computer system 3000 may include one or more power supplies 3002, one or more monitors 3004 (for example, a conventional and/or touch-screen monitor), one or more input devices 3006, for example, a mouse, a keyboard, and/or a stylus, a main or motherboard 3008, to which one or more components 3010 are attached. The one or more subcomponents 3010 may be one or more central processing units (CPUs), one or more memories, and/or one or more cards. The computer system 3000 may include one or more additional memories 3012, which may be removable or more easily removable.

In example embodiments of the inventive concept, the computer system 3000 may be desktop, personal computer, a laptop personal computer, and/or a handheld personal computer. In example embodiments of the inventive concept, the computer system 3000 may be a server.

Example embodiments of the inventive concept of solid state device products, as discussed above may be implemented as components or sub-components in one or more computer system 3000, as described above.

In example embodiments of the inventive concept, the solid state device products disclosed herein may be SSDs, for example, electronics with no moving parts, hence, less fragile than hard disks, having no mechanical delays, and/or lower access times and/or latency than electromechanical devices.

In example embodiments of the inventive concept, the solid state device products disclosed herein may be components of flash memories, for example, NAND or NOR flash memories. In example embodiments of the inventive concept, the circuit boards, connectors, cases, circuit board assemblies, case assemblies, devices disclosed herein may be components of Multi-level cell (MLC) flash memory or Single-level cell (SLC) flash memory.

In example embodiments of the inventive concept, the solid state device products disclosed herein may be components of DRAM memories.

In example embodiments of the inventive concept, the solid state device products may be of various form factors. In example embodiments of the inventive concept, the form factor may be the 1.8 inch or 2.5 inch SATA-2 standard structures. In example embodiments of the inventive concept, the form factor may be the 3.5-inch SATA-2 standard structure or another structure, for example, a CompactFlash Type (for example, Type I or II), SD memory card, miniSD, microSD, TransFlash, MultiMediaCard (MMC), MMCplus, RS-MMC, DV RS-MMC, MMCmobile, MMCmicro, Memory Stick, Memory Stick PRO, Memory Stick Duo, Memory Stick PRO Duo, SmartMedia Card, xD-Picture Card, PC Card (for example, Types I, II, or III), and/or USB Flash Drive Example embodiments of the inventive concept being thus described, it will be obvious that the same may be varied in many ways. Such variations are not to be regarded as a departure from example embodiments of the inventive concept, and all such modifications are intended to be included within the scope of append claims.

What is claimed is:

1. A solid state device product, comprising:
   at least one on-board electronic connector configured to be connected to external electronic equipment;
   at least one solid state memory including a memory interface including at least one of data inputs, data outputs, control signals, and address signals; and
   a board to which the at least one solid state memory is attached, the board including a host interface including at least one of the data inputs, the data outputs, the control signals, and the address signals and an interface replicating the memory interface of the at least one solid state memory including the data inputs, the data outputs, the control signals, and the address signals,
   wherein the interface replicating the memory interface is configured to be tested in-situ with the solid state memory on the board.

2. The solid state device product of claim 1, wherein at least one of the memory interface, the host interface, and the interface replicating the memory interface have additional signals.

3. The solid state device product of claim 1, wherein at least one of the memory interface, the host interface, and the interface replicating the memory interface have different pin configurations.

4. The solid state device product of claim 1, wherein at least one of the memory interface, the host interface, and the interface replicating the memory interface have at least one common input and output.

5. The solid state device product of claim 1, wherein the board includes a printed circuit board (PCB).

6. The solid state device product of claim 1, wherein at least one of the memory interface, the host interface, and the interface replicating the memory interface include a plurality of input and outputs is used for normal operation.

7. The solid state device product of claim 1, wherein the interface replicating the memory interface is used for testing.

8. The solid state device product of claim 1, wherein the at least one solid state memory is a NAND flash, a PRAM, an MRAM, an FRAM, or an RRAM.

9. The solid state device product of claim 1, wherein the interface replicating the memory interface of the at least one solid state memory is at least on an edge of the board.

10. The solid state device product of claim 1, wherein the interface replicating the memory interface of the at least one solid state memory is on an edge of the board and on at least the top and bottom of the board.

11. The solid state device product of claim 1, wherein the interface replicating the memory interface of the at least one solid state memory is an exposed interlayer of the board.

12. The solid state device product of claim 1, wherein the interface replicating the memory interface of the at least one solid state memory is not a top of a top layer of the board and not a bottom of a bottom layer of the board.

13. The solid state device product of claim 1, wherein the interface replicating the memory interface of the at least one solid state memory is an exposed multilayer including at least one exposed interlayer.

14. The solid state device product of claim 1, wherein the interface replicating the memory interface of the at least one solid state memory is a middle layer and a top of a top layer of the board or a bottom of a bottom layer of the board.

15. The solid state device product of claim 1, further comprising:
   a removable auxiliary board area, the removable auxiliary board area being configured to connect the interface replicating the memory interface.

* * * * *